United States Patent
Sinha

(10) Patent No.: US 7,115,515 B2
(45) Date of Patent: Oct. 3, 2006

(54) METHODS FOR FORMING CAPACITOR STRUCTURES

(75) Inventor: Nishant Sinha, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/208,793

(22) Filed: Aug. 22, 2005

(65) Prior Publication Data

US 2006/0003537 A1    Jan. 5, 2006

Related U.S. Application Data

(60) Division of application No. 10/734,995, filed on Dec. 12, 2003, which is a continuation of application No. 10/134,201, filed on Apr. 25, 2002, now Pat. No. 6,706,632.

(51) Int. Cl.
*H01L 21/302* (2006.01)

(52) U.S. Cl. .................. 438/690; 257/E21.214

(58) Field of Classification Search ............... 438/689, 438/690, 386, 396
See application file for complete search history.

(56) References Cited

U.S. PATENT DOCUMENTS

| | | | |
|---|---|---|---|
| 3,778,530 A | 12/1973 | Reimann | |
| 5,391,511 A * | 2/1995 | Doan et al. | .................. 438/396 |
| 6,281,535 B1 | 8/2001 | Ma et al. | |
| 6,416,685 B1 | 7/2002 | Zhang et al. | |
| 6,431,953 B1 | 8/2002 | Carter et al. | |
| 6,468,858 B1 | 10/2002 | Lou | |
| 6,706,632 B1 | 3/2004 | Sinha | |

* cited by examiner

*Primary Examiner*—W. David Coleman
(74) *Attorney, Agent, or Firm*—Wells St. John P.S.

(57) ABSTRACT

The invention includes methods of forming capacitor structures and removing organic material. An organic material, such as a photoresist, is disposed on a substrate. The organic material is contacted with a chemical mechanical polishing pad and a polishing fluid to remove the organic material from the substrate. The polishing fluid can be essentially free of particles, and can be water.

8 Claims, 5 Drawing Sheets

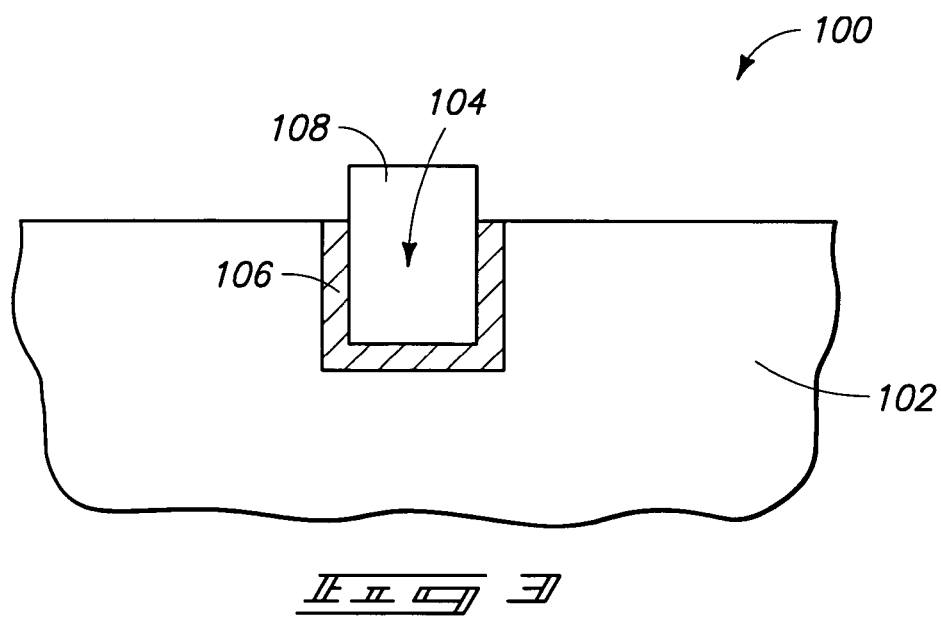
_Fig. 3_
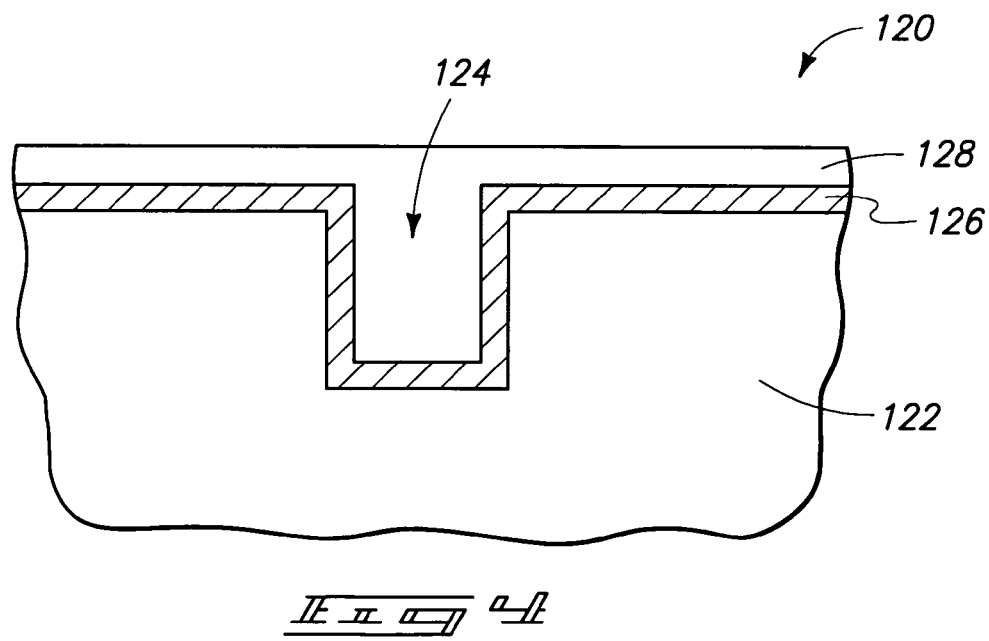
_Fig. 4_

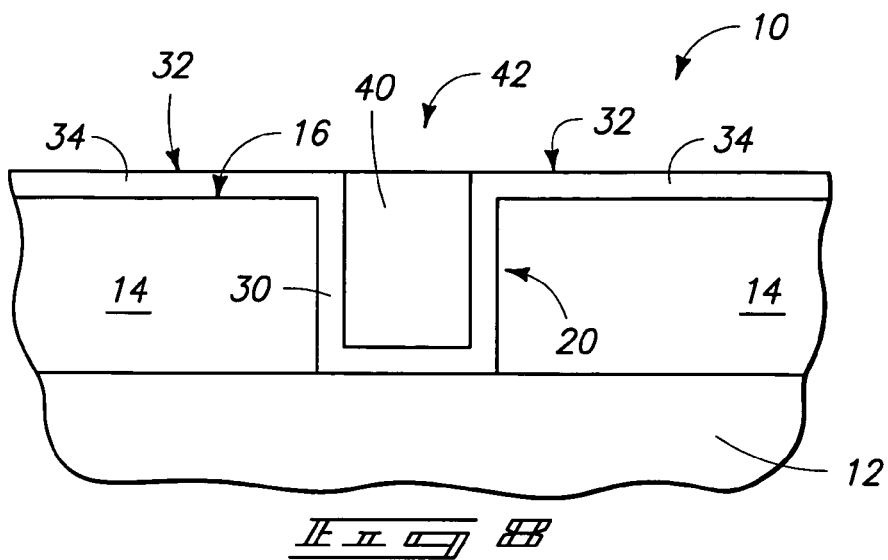
F I G. 8B
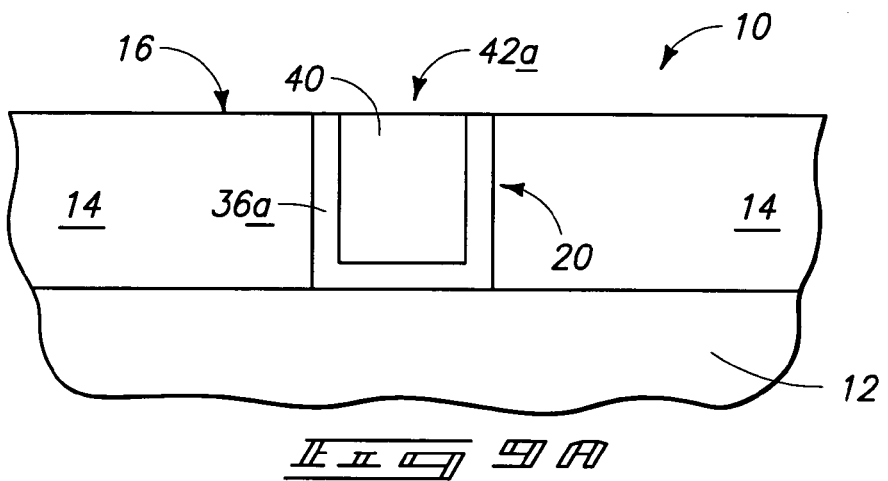
F I G. 9A
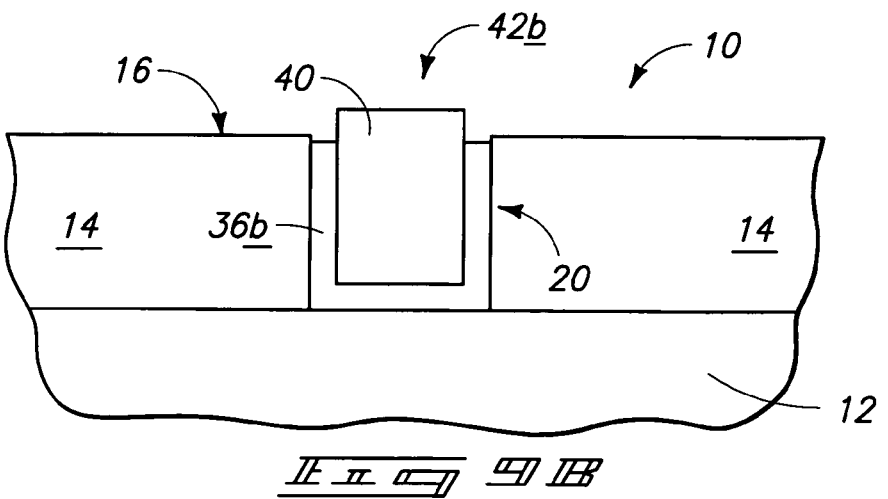
F I G. 9B

METHODS FOR FORMING CAPACITOR STRUCTURES

CROSS REFERENCE TO RELATED APPLICATION

This application is a divisional of U.S. application Ser. No. 10/734,995, filed on Dec. 12, 2003, entitled "Methods for Removal of Organic Materials", which is a continuation of U.S. application Ser. No. 10/134,201 filed on Apr. 25, 2002, entitled "Methods for Forming Capacitor Structures; and Methods for Removal of Organic Materials", now U.S. Pat. No. 6,706,632 B2; the entirety of all of which are incorporated by reference herein.

TECHNICAL FIELD

The present invention relates generally to semiconductor processing. In particular applications the invention pertains to methods of forming capacitor structures and methods of resist removal.

BACKGROUND

Increased performance, both with regard to more complex functionality and higher speeds, is a continuing goal of efforts in advancing the semiconductor arts. One method that has been used for achieving this goal is scaling downward the size of individual devices used in forming advanced semiconductor integrated circuits. However, it is found that at times, changes in the components used in fabricating such down-sized devices are advantageous. For example, where capacitors, such as those used in memory integrated circuits, are scaled downward in size, dielectric materials such as silicon oxide and silicon nitride are often replaced with alternate materials having a higher dielectric constant to achieve desired capacitance. Where such replacements of dielectric materials are made, it can be advantageous to form capacitor electrodes comprising one or more of platinum, tantalum, ruthenium, iridium, and titanium. Such electrodes can comprise, for example, alloys of various metals and/or nitrides of various metals, including, for example, titanium nitride. The capacitors comprising metallic electrodes are well known in the art, and are frequently described as metal-insulator-metal capacitor constructions.

One method for patterning various dielectric and conductive materials is chemical mechanical polishing (CMP). A material (such as platinum), can be blanket formed within an opening and over surfaces proximate the opening. The material can be removed from over the surfaces by a CMP method. The material within the opening, elevationally below that upper surface, will not be removed. The material within the opening can ultimately form a capacitor electrode structure. A problem with the CMP method can be scratching or smearing of the material, which can prevent the proper forming of the ultimately desired capacitor structure. For instance, if the material is platinum or an alloy of platinum, scratching or smearing of the platinum can occur in a CMP process. It can be difficult, and for all practical purposes impossible, to remove smeared platinum from within a container.

It would be desirable, to develop a CMP method where the removal of portions of various materials (such as platinum or barrier materials) can be effected without scratching or smearing across surfaces of the materials. It would also be desirable if such a CMP method was cost-effective and could be performed using essentially standard CMP processing tools.

SUMMARY

In one aspect, the present invention can provide methods for forming structures (such as capacitor or plug structures) and/or removing resist from a semiconductor substrate. A material is formed over a substrate, and a resist layer is formed over the material. Subsequently, at least a portion of the resist layer is removed to expose a desired portion of the material. The resist layer can be removed by providing contact of a chemical mechanical polishing pad and a polishing fluid with the resist layer. Such contact can be provided by a chemical mechanical polishing system that encompasses a mechanism for moving the polishing pad and/or the substrate. In some embodiments of the present invention it is advantageous to provide that the polishing fluid has a particle concentration of less than or equal to about 0.1% by weight of a silica-comprising material, and in particular embodiments it is advantageous for the polishing fluid to be essentially free of particles. In particular aspects, the polishing fluid can comprise tetramethylammonium hydroxide (TMAH) or ammonia to increase a rate of removal of various compositions by the fluid.

Some embodiments of the present invention provide for forming a recess within the semiconductor substrate prior to forming the material that is to be covered by the resist. For such embodiments, the material can be formed to partially fill the recess and extend outward over an upper surface of the semiconductor substrate. The resist layer can be formed within the partially filled recess.

A suitable semiconductor substrate can encompass a semiconductive portion and an overlying insulative portion. For embodiments that encompass a recess, such recess can be formed within the insulative portion. In some embodiments the recess extends to expose, at a bottom and/or sidewalls of the recess, a portion of the semiconductive portion or a portion of a conductive device formed over or in the semiconductive portion. Where the material encompasses a conductive material, electrical communication between the conductive material and the semiconductive portion or conductive device can be provided through the bottom or sidewalls of the recess. In some embodiments of the present invention, the material can include more than one layer. For example, the material can encompass a first layer of a first composition and a second layer of a second composition overlying the first layer. The two compositions can be, for example, a first composition comprising metal, nitrogen, and silicon (such as TaSiN); and a second composition consisting essentially of metal and nitrogen (such as TaN).

BRIEF DESCRIPTION OF THE DRAWINGS

Preferred embodiments of the invention are described below with reference to the following accompanying drawings.

FIG. 3 is a view of the FIG. 1 construction at a processing stage subsequent to that of FIG. 2.

FIG. 4 is a diagrammatic, cross-sectional, fragmentary view of a construction at a preliminary stage of a fabrication process of forming a barrier layer.

FIG. 8 is a cross-sectional representation of the portion of a semiconductor substrate depicted in FIG. 7 at a subsequent process stage of an exemplary embodiment of the present invention.

FIGS. 9A and 9B are cross-sectional representations of the portion of a semiconductor substrate depicted in FIG. 8 at alternate subsequent process stages of exemplary embodiments of the present invention.

DETAILED DESCRIPTION

This disclosure of the invention is submitted in furtherance of the constitutional purposes of the U.S. Patent Laws "to promote the progress of science and useful arts" (Article 1, Section 8).

The present invention can encompass methods of polishing resist to remove the resist from over conductive materials. An exemplary embodiment of the present invention is described with reference to FIGS. 1–3.

Figure 1:
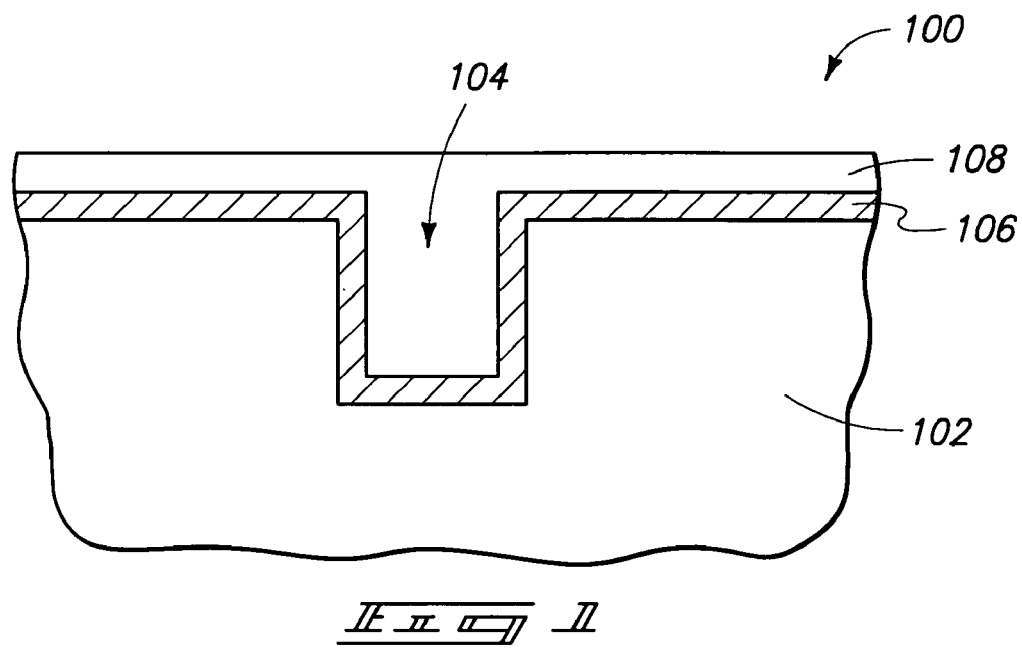
FIG. 1 is a diagrammatic, cross-sectional, fragmentary view of a construction at a preliminary stage of an exemplary semiconductor fabrication process.

Referring to FIG. 1, a construction 100 comprises a mass 102 having an opening 104 extending therein. Mass 102 can comprise an insulative material such as, for example, borophosphosilicate glass (BPSG) and/or silicon dioxide deposited from TEOS, and can be supported by a semiconductor substrate (not shown). To aid in interpretation of the description of the illustrations and claims that follow, the term "semiconductor substrate" is defined to mean any construction encompassing silicon semiconductive material, including, but not limited to, bulk silicon semiconductive materials such as a silicon semiconductor wafer (either alone or in assemblies encompassing other materials thereon) and silicon semiconductive material layers (either alone or in assemblies encompassing other materials). The term "substrate" refers to any supporting structure, including, but not limited to, the semiconductor substrates described above.

A metal-containing layer 106 extends over mass 102 and within opening 104. Layer 106 can consist essentially of, for example, platinum or a platinum-containing alloy. A layer 108 is formed over layer 106. Layer 108 can comprise, for example, photoresist, and fills opening 104.

Figure 2:
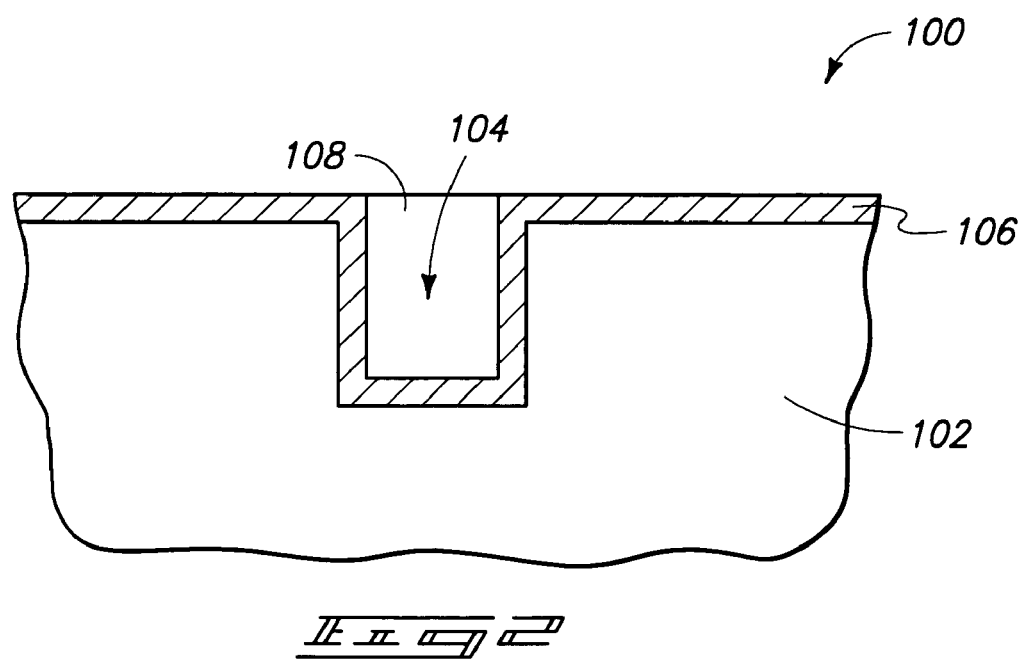
FIG. 2 is a view of the FIG. 1 construction at a processing stage subsequent to that of FIG. 1.

Referring to FIG. 2, layer 108 is polished from over layer 106 to expose portions of layer 106 proximate opening 104. The layer 108 is not, however, removed from within opening 104. The polishing of layer 108 preferably utilizes a polishing pad in combination with a solution substantially lacking in particulates. Accordingly, in particular aspects of the invention, the polishing of layer 108 occurs through mechanical action of the pad alone. The polishing proceeds through layer 108, but stops on layer 106. The polishing can be accomplished with little, if any, smearing or scratching of layer 106. It is noted that in some aspects of the invention the polishing solution can consist essentially of water, and in other aspects the polishing solution can comprise a combination of chemicals. For instance, the solution can comprise a combination of water and a base (such as, for example, TMAH), so that the solution has a basic pH.

Referring to FIG. 3, the exposed portions of layer 106 are removed with a dry etch. In subsequent processing (not shown), resist 108 can be removed from within opening 104 by, for example, ashing.

A process similar to that described with reference to FIGS. 1–3 can be utilized for etching of various so-called barrier layers. Barrier layers are provided, for example, to alleviate diffusion of Si and O at elevated temperatures, and can be incorporated into various capacitor structures. An exemplary material which can be utilized as a barrier layer is $TaSi_xN_y$ (which can also be referred to herein as TaSiN, with the Ta, Si and N of the representation "TaSiN" referring to the elements contained within the designated compound and not to any particular stoichiometric relationship of the elements).

A barrier layer fabrication process is described with reference to FIG. 4. Specifically, FIG. 4 shows a construction 120 comprising a mass 122 having an opening 124 extending therein. Mass 122 can comprise an insulative material such as, for example, silicon dioxide, and can be supported by a semiconductor substrate (not shown). A barrier layer 126 extends over mass 122 and within opening 124. Layer 126 can comprise, for example, $TaSi_xN_y$. A layer 128 is formed over layer 126. Layer 128 can comprise, for example, photoresist, and fills opening 124.

Ultimately, the barrier layer material 126 is to be removed from over an uppermost surface of mass 122, but left within opening 124. Such can be accomplished with processing analogous to that discussed above with reference to FIGS. 1–3.

Figure 5:
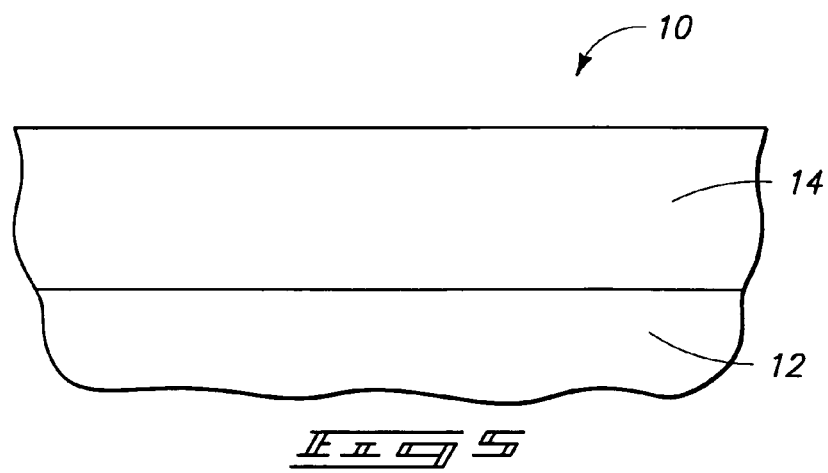
FIG. 5 is a cross-sectional representation of a portion of a semiconductor substrate at an early process stage of an exemplary embodiment of the present invention.

FIG. 5 depicts a cross-sectional representation of a portion of a semiconductor substrate 10 having an insulative portion 14 disposed over a semiconductive substrate 12. Insulative portion 14 can encompass one or more layers of a variety of exemplary materials such as, for example, silicon oxide, silicon nitride and silicon oxynitride. In particular embodiments of the present invention, portion 14 encompasses a BPSG (BoroPhosphoSilicate Glass) material or a TEOS-deposited silicon dioxide. Semiconductive portion 12 can encompass a single crystal silicon material.

Figure 6:
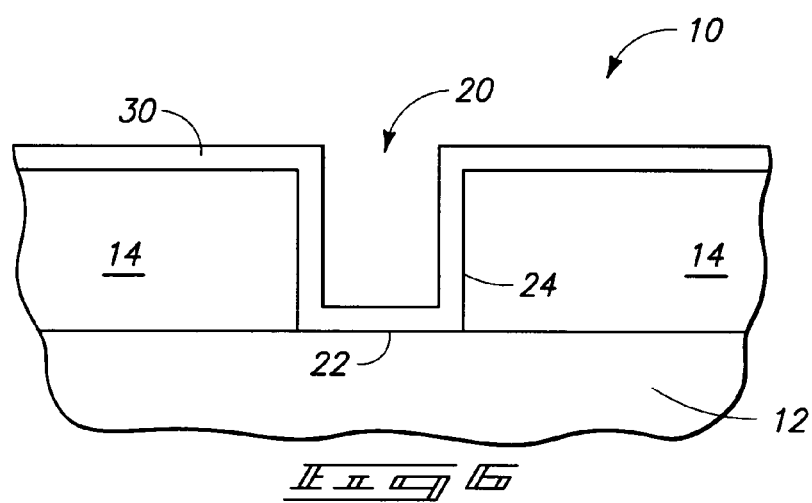
FIG. 6 is a cross-sectional representation of the portion of a semiconductor substrate depicted in FIG. 5 at a subsequent process stage of an exemplary embodiment of the present invention.

Referring to FIG. 6, structure 10 is illustrated after a recess 20 is formed within portion 14. Recess 20 is typically formed by a patterning process that encompasses a masking step and an etching step. Recess 20 has a bottom 22 and sidewalls 24. As depicted, bottom 22 is elevationally at an upper surface 16 of semiconductive substrate 12. However, such is illustrative only and it will be understood that in some embodiments of the present invention bottom 22 is elevationally above and displaced from upper surface 16. For example, in some embodiments, bottom 22 can be at an upper surface of an integrated circuit device such as a conductive line disposed on semiconductive substrate 12 (not shown). After forming recess 20, a layer of material 30 is formed over substrate 10. Material 30 is within recess 20 and extends laterally outward from recess 20 over insulative portion 14. More specifically, material 30 is over bottom 22 and sidewalls 24 of recess 20, only partially filling recess 20.

Material 30 can encompass conductive materials such as platinum (Pt), iridium (Ir), ruthenium (Ru), tantalum (Ta), titanium (Ti) and mixtures or alloys of such materials. In addition, or alternatively, material 30 can encompass oxides, nitrides and suicides of various metals. For example, in some embodiments in accordance with the present invention, material 30 encompasses one or more of a platinum-ruthenium alloy, ruthenium oxide (RuO), tantalum silicon nitride (TaSiN) or ruthenium silicide (RuSi). In addition, it will be understood that for some embodiments of the present invention, material 30 is formed of more than one layer. In one exemplary embodiment of the present invention, a barrier layer (not shown) such as a tantalum silicon nitride (TaSiN) material is first formed over insulative portion 14 and within recess 20 and a second layer of electrode material (not shown) such as tantalum nitride (TaN) is second formed over the barrier layer and within recess 20.

In particular aspects of the invention, material 30 can comprises a tantalum-containing mass. Such mass can include one or both of silicon and nitrogen in addition to the tantalum.

Figure 7:
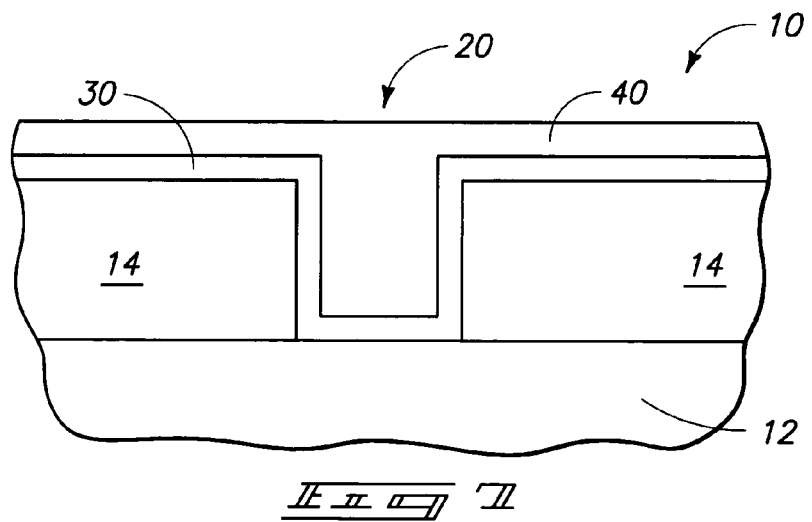
FIG. 7 is a cross-sectional representation of the portion of a semiconductor substrate depicted in FIG. 6 at a subsequent process stage of an exemplary embodiment of the present invention.

Referring to FIG. 7, a layer 40 comprising, consisting essentially of or consisting of, an organic material (such as an organic polymer), is depicted over substrate 10. Specifically, layer 40 is formed over material 30 and fills recess 20. Layer 40 can, in particular applications, comprise, consist essentially of, or consist of, a photoresist material. For example, layer 40 can comprise an exemplary photoresist material designated OiR 897 10i™ and manufactured by Arch Microelectronics, of Norwalk, Conn. Additionally, or alternatively, layer 40 can comprise resist compositions formed without a photosensitive component (non-photosensitive resists) and/or polyimide materials.

Resist or organic material layer 40 can be formed using any of several appropriate process methods, for example by spin coating, spraying or dip-coating. In this manner a generally uniform layer 40 is provided that advantageously fills recess 20 (FIG. 6) as depicted. After layer 40 is formed, it can be subjected to what is commonly referred to as a "hard" bake. The specific processing conditions for the application and baking of the material used to form resist layer 40 will be understood, by one of ordinary skill in the semiconductor arts, to depend on the specific material employed for resist layer 40. Thus where the exemplary OiR 897 10i™ material is used, it has been found advantageous to apply such material by a spin-coating process and to subsequently hard bake the layer at a temperature of from about 85 degrees Celsius (° C.) to about 100° C. for a period of time from several tens of seconds to several minutes in duration.

Referring to FIG. 8, the structure of FIG. 7 is depicted after a portion of resist layer 40 is removed. As shown, resist layer 40 is removed such that segments 34 of material 30 outward of and adjacent to recess 20 are exposed and a resist plug 42 within recess 20 is formed. Layer 40 has thus been removed selectively relative to material 30.

The removal of the portion of resist or organic material layer 40 can be accomplished by providing contact of a chemical mechanical polishing pad and a polishing fluid (not shown) with resist layer 40. The term "chemical mechanical polishing (CMP) pad" refers to a construction traditionally employed for performing chemical mechanical polishing. Such constructions can include pads used in a system for chemical mechanical polishing where the CMP pad is provided to have at least one of rotational motion about an axis and linear motion along an axis. CMP pads utilized with embodiments of the present invention can encompass a polyurethane material and are manufactured by, for example, Rodel Products of Phoenix, Ariz. and Thomas West, Inc. of Sunnyvale, Calif. Chemical mechanical polishing systems that provide the at least one of linear motion and rotational motion include, for example, the TERES™ CMP System manufactured by LAM Research Corporation of Fremont, Calif. and the MIRRA MESA ADVANCED INTEGRATED CMP SYSTEM™ manufactured by Applied Materials, Inc., of Santa Clara, Calif., respectively. Exemplary pads are those formed of a rigid or semi-rigid microporous polyurethane material, or polyurethane-impregnated polyester material or a combination of such materials, although other appropriate materials can be used. The specific pad employed will depend, in part, on the specific resist material employed and the conditions at which the selected resist material was processed to form layer 40. It is noted that harder pads can induce a faster CMP removal rate of resist than softer pads through increased mechanical action. However, the harder pads may also create more scratches than softer pads to an underlying material 34. Accordingly, the physical characteristics of a polishing pad can be chosen to balance a desired removal rate with an acceptable level of scratching in material 34.

In addition to the pad characteristics, the nature of the polishing fluid employed in contact with both the CMP pad and resist layer 40 can be a factor in determining an advantageous CMP pad material and/or construction. Accordingly, it can be desired to adjust a pH of the polishing fluid to a desired range. In particular applications, TMAH can be utilized in a polishing solution when a basic pH is desired.

Chemical mechanical polishing is known in the art to be suitable for removing a wide variety of materials. Typically such materials are hard materials such as silicon oxide, silicon nitride, polycrystalline silicon and the like. While the polyurethane material typically employed to form CMP pads has some degree of roughness, material removal effected by such pads is believed the result, in significant part, of abrasive particles that are typically included into the polishing fluid or slurry and not the pad itself. In addition, the polishing fluid typically encompasses a material that is chemically reactive with regard to the materials being polished and thus is also generally significant in the removal of a material. Thus CMP is the combined action of (1) the chemical reactivity between the fluid and the materials being polished or removed, (2) the abrasiveness of the included particles, and (3) the effect of the CMP pad to create a pressure of contact and a linear velocity, in excess of zero, of that contact through which (1) and (2) can interact with the material being polished and/or removed.

Embodiments of the present invention, however, can employ a polishing fluid that is selected to be essentially unreactive with both resist or organic material layer 40 and conductive material layer 30. In addition, such fluid is typically provided having few, if any, particles. Exemplary materials for such a polishing fluid include, water having essentially no particles, or an aqueous based polishing fluid having silica-comprising particles where the concentration of such particles is less than or equal to 0.1% by weight. Thus absent the chemical reactivity and the abrasiveness of included particles, it is theorized that the principle mechanism for the removal of resist layer 40 is the abrasiveness of the CMP pad and the pressure with which such pad contacts layer 40. Advantageously, it is found that where such a polishing fluid and CMP pad are used for removing resist layer 40 to expose substantially all of upper surfaces 32 of material 30, the absence of particles in the polishing fluid and the generally unreactive nature of the polishing fluid itself, provide that upper surfaces 32 are essentially unpolished. That is to say that exposed portions 34 of material 30 act essentially as an etch or polish stop layer and resist removal is essentially stopped with the forming of resist plug 42. It will be understood, as the polishing fluid employed by embodiments of the present invention use little or no particulates in the polishing fluid, that when resist layer 40 is removed to expose upper surface 32, there is little or no removal of such material. Thus scratches and/or smears are essentially or entirely eliminated.

It is noted that particles can be generated during polishing of a resist, with the particles corresponding to removed fragments of the resist. In particular applications of the invention, a total amount of particles within a fluid utilized for removing resist, other than particles generated from the removal of the resist, is less than or equal to 0.1%, by weight, of a polishing fluid. In some embodiments the number of particles in the fluid, other than particles generated from resist removal, is 0%, or in other words, non-detectable.

In particular aspects of the invention, chemical reactivity of a polishing fluid can be enhanced by, for example, shifting a pH of the polishing fluid. Such can be accomplished by, for example, incorporating one or both of ammonia and TMAH within the polishing fluid. Preferably, the increase in chemical reactivity of the polishing fluid will be relative to mass 40 (FIG. 7) and not material 30. Accordingly, removal of mass 40 relative to material 30 will be further enhanced by the additional chemical reactivity of the polishing fluid. In applications in which material 30 comprises platinum and mass 40 comprises photoresist, it can be desirable to include one or both of ammonia and TMAH in the polishing fluid to obtain a pH of the polishing fluid of from about 8 to about 12.

While various organic materials are appropriate for forming resist layer 40, and while various polishing fluids, CMP pad materials and the like can be selected for removing layer 40 from over material 30 adjacent recess 20 to form the structure depicted in FIG. 4, it has been found advantageous where an OiR 897 10i™ resist is selected and formed employing a hard bake step at a temperature of about 92° C. for about 60 seconds, to use a Rodel IC1000™ or 1400 CMP™ pad, or Sycamore OXP™ pad, and a polishing fluid having an initial particulate concentration of less than or equal to 0.1% by weight for the removal. As one of skill in the semiconductor arts will understand, where other materials and process conditions are employed for forming resist layer 40 (FIG. 3), tailoring CMP processing conditions to form plug 42 and to expose portions 34 of material 30 is made possible by this disclosure.

In some embodiments of the present invention, an apparatus to determine a resist removal endpoint is employed. For example, the torque required to provide motion of the CMP pad with respect to the substrate will vary when material 30 becomes substantially exposed, that is to say, when essentially all of the resist layer is removed from over upper surfaces 32 of material 30. Thus an apparatus for monitoring changes in torque can be effective for determining the endpoint. Other methods and devices for determining endpoint are also possible. For example, as material 30 becomes exposed, the reflectivity of substrate 10 will change. Thus an apparatus for monitoring reflectivity can also be effective for determining the endpoint of the resist removal.

Referring to FIG. 9A, the structure of FIG. 8 is shown at one alternate, subsequent processing stage. The exposed portions 34 of layer 30 (FIG. 8) are removed defining a portion 36a of layer 30 within recess 20 as well as an essentially planar upper surface 16a of semiconductor substrate 10 laterally adjacent recess 20. Exposed portions 34 can be removed employing a chemical mechanical polishing method where a second polishing fluid or slurry is provided, replacing the polishing fluid used for removing the resist, once the structure of FIG. 8 is formed. In other embodiments, both the polishing fluid and CMP pad are changed. It will be understood that such changes of the polishing fluid and/or the CMP pad can be effected at a single polishing station or by moving substrate 10 to an alternate station, where such alternate station has the changed material(s).

Second polishing fluid, and where employed a second CMP pad, are selected to provide effective removal of exposed portions of layer 34 (FIG. 8). Thus the second fluid is different from the first fluid in that it typically has an increased initial concentration of particles and will typically be chemically reactive to the conductive material of layer 34. Where a second CMP pad is used, such second pad is compatible with the second fluid. In addition, the second fluid will typically have an enhanced reactivity toward the material of exposed portions 34 being removed, as compared to the first fluid's general absence of reactivity to the material of exposed portions 34.

It will be noted while the CMP processing used to remove exposed portions 34 can also remove some of resist plug 42a, such plug advantageously serves to protect recess 20. That is to say, if the removal of exposed portions 34 (FIG. 8) during a CMP process results in scratches or smearing of the material of portions 34, resist plug 42a prevents such scratches and smears from effecting the structure formed within recess 20. In other words, resist plug 42a can prevent the removed material of exposed portions 34 from entering recess 20 during CMP removal of such exposed portions and coming in contact with or being proximate to portions 36a.

In a particular aspect of the invention the processing of FIGS. 5–9A is utilized in formation of a material 34 comprising TaSiN and/or TaN (with the materials being described in terms of the atoms comprised by the materials rather than any particular stoichiometry). The polish utilized to remove resist 40 between the stage of FIG. 7 and that of FIG. 8 is a first polish comprising substantially no particles in the polishing fluid. The polish utilized to remove material 30 in proceeding from the stage of FIG. 8 to that of FIG. 9A is a second polish utilizing particles. An exemplary polish for proceeding from the stage of FIG. 8 to that of FIG. 9A utilizes a polishing slurry comprising a material available from Hitachi as T605™, together with from about 0.1 wt % to about 0.5 wt % $H_2O_2$. The polishing of resist 40 thus utilizes a solution tailored to remove resist 40, and the polishing of material 30 utilizes a solution tailored to remove material 30. Accordingly, the removal of each of materials 40 and 30 can proceed with high uniformity. In some aspects of the invention, better uniformity can be obtained by utilizing the two tailored etching solutions than by using a single etching solutions to remove both of materials 40 and 30 in proceeding from the stage of FIG. 7 to that of FIG. 9A.

FIG. 9B depicts an alternate embodiment where exposed portions 34 (FIG. 8) are removed using a chemical or a plasma etching method. As depicted, a raised plug 42b is seen to extend upward from surface 16b of substrate 10. Thus subsequent to the forming of resist plug 42 and exposed portions 34 (FIG. 8), substrate 10 is either exposed to a chemical solution or plasma that removes the material of such exposed portions. Such chemical solution or plasma is selected to be essentially unreactive with respect to the resist material and thus a raised plug 42b is formed. Analogous to what was seen for the structure of FIG. 9A, plug 42b serves to protect portion 36b within recess 20.

Figure 10:
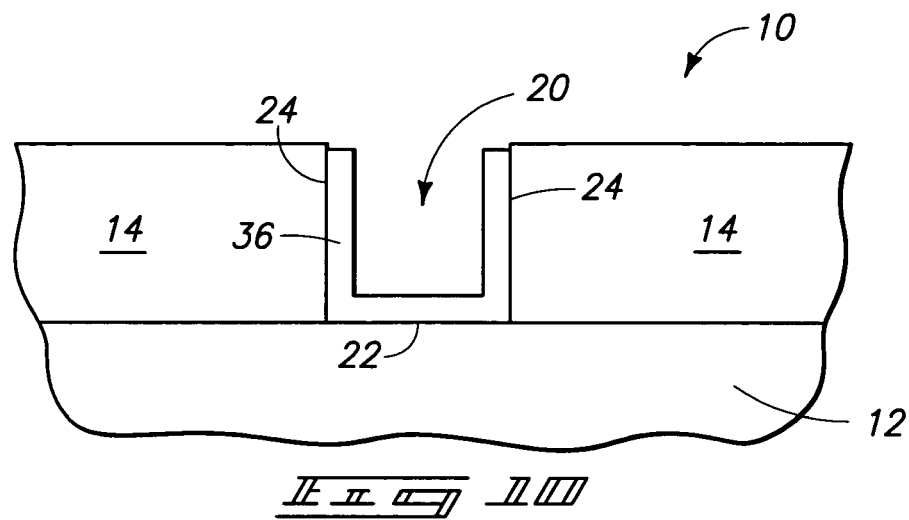
FIG. 10 is a cross-sectional representation of the portion of a semiconductor substrate depicted in FIG. 9A at a subsequent process stage of an exemplary embodiment of the present invention.

Referring to FIG. 10, a structure is illustrated subsequent to the processing of FIG. 9A or 9B, and specifically, subsequent to the removal of resist plugs 42a or 42b. Plugs 42a or 42b can be removed by employing a chemical solution or plasma tailored to remove the material of the plugs. Where plugs 42a and/or 42b are a photoresist material, one exemplary removal method is an oxygen plasma, although any appropriate method can be used. As seen, material layer 30 is transformed into layer 36 entirely within recess 20 and adjacent bottom 22 and sidewalls 24 of such recess 20. Layer 36 can be, for example, an electrode of a capacitor structure, some or all of which to be formed within recess 20. Advantageously, the structure depicted in FIG. 10 has been formed without a photomasking step subsequent to the forming of recess 20. Rather, as shown above, the patterning to form layer 36 within recess 20 can be accomplished, in some embodiments, using essentially blanket depositions and CMP processing only. In other embodiments, chemical or plasma processing can be used, after the forming of plug 42 (FIG. 8), to define layer 36 as discussed above, also without the need for a photomasking step.

Figure 11:
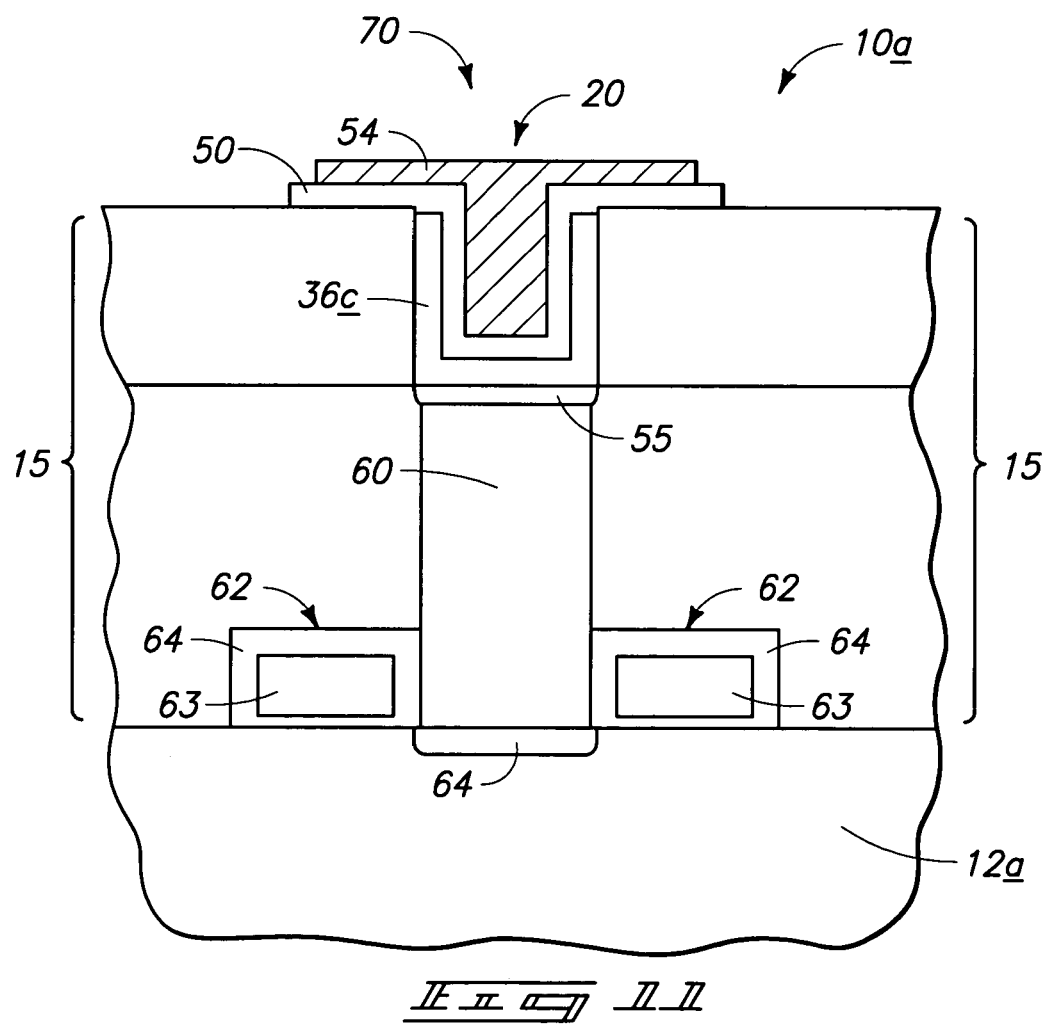
FIG. 11 is a cross-sectional representation of an integrated capacitor structure formed employing methods of exemplary embodiments of the present invention.

Referring to FIG. 11, a portion of a semiconductor substrate 10a encompassing a semiconductive portion 12a overlying insulative portions 15 is depicted. A portion of a capacitor structure 70, in accordance with embodiments of the present invention, is shown disposed within an upper, second formed portion of insulative layers 15.

Within semiconductive portion 12a is a conductive node 64, disposed laterally between and elevationally below conductive line structures 62. Conductive plug 60 is depicted disposed above and in electrical communication with conductive node 64. Where conductive plug 60 encompasses a doped polysilicon material, generally a contact enhancement material layer 55 encompassing a metal silicide (such as titanium silicide) is disposed over and in electrical communication with the polysilicon of conductive plug 60.

Turning to capacitor structure 70, disposed within an upper or second formed part of insulative portion 15, such encompasses recess 20 having a material layer 36c formed therein. Recess 20 being formed in a manner analogous to the methods previously discussed with regard to FIG. 6, and material layer 36c being formed and subsequently defined in a manner analogous to the defining of layer 36 from layer 30 in FIG. 9A or 9B. Material layer 36c, however, encompasses a diffusion barrier material and can be formed of a single such diffusion barrier material, or alternatively of such a barrier material and a conductive material, such as described previously for layer 30. Exemplary diffusion barrier materials include, among others, tantalum nitride and/or tantalum silicon nitride, while exemplary conductive materials include, among others, materials comprising Pt, Ru, Ta and mixtures or alloys thereof. It will be understood that while exemplary materials for layer 36c are provided, other barrier materials and/or combinations of barrier materials and conductive materials other can also be employed. Any and all of such materials can be formed by appropriate methods such as chemical vapor deposition of physical vapor deposition methods.

Typically where capacitor structure 70 employs a high dielectric constant material layer 50, barrier layer material is provided within layer 36c to reduce and/or eliminate any reactive interactions, for example between such dielectric material and the material of plug 60 or the material of insulative portion 15 or any other such interaction between materials in communication with one another. Exemplary high dielectric constant materials employed for layer 50 include, but are not limited to, $Al_2O_3$, $Ta_2O_5$, and barium strontium titanate (BST). As depicted, layer 50 does not fill recess 20 and a second capacitor electrode layer 54 is shown formed and patterned. Such second electrode layer generally encompasses a material similar to that of material layer 36 (FIG. 9A). Advantageously the structure depicted for capacitor structure 70 is formed by methods analogous to those previously described with respect to FIGS. 5–10.

It will be recognized that embodiments of the present invention include methods for forming capacitor structures and removing resist that provide for the removal of portions of a material without preventing the proper forming of a desired capacitor structure. Embodiments of the present invention can also provide for reduced scratching and smearing of electrode materials by removing portions of the resist without the use of particulates within a polishing fluid or in the alternative with very low initial concentrations of particulates. In this manner, little or no scratching or smearing occurs as conductive materials are exposed. In addition, embodiments of the present invention can provide a CMP method that eliminates the use of a photomasking step for patterning at least one capacitor electrode. As is known, the removal of a photomasking step can serve to reduce processing costs and generally to increase process yield.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method for forming a capacitor structure comprising:
   providing a substrate comprising an insulative layer over a semiconductive layer, the insulative layer having a recess therein, the recess having a periphery comprising a bottom and sidewalls, wherein the bottom comprises an upper surface of the semiconductive layer;
   forming a first conductive-material-comprising layer over the substrate, the first conductive-material-comprising layer lining the bottom and the sidewalls to partially fill the recess and extending laterally outward from the recess over an upper surface of the substrate;
   filling the partially filled recess with an organic material, the filling forming an organic material layer over an upper surface of the first conductive-material-comprising layer;
   removing at least a portion of the organic material with a pad and an organic-material-removing fluid, wherein the organic-material-removing fluid is substantially unreactive with the first conductive-material-comprising layer and comprises less than or equal to 0.1 weight percent particles at an initiation of the removing;
   stopping the removing when substantially all of an upper surface of the laterally extending first conductive-material-comprising layer is exposed;
   forming a dielectric layer over the first conductive-material-comprising layer; and
   forming a second conductive-material-comprising layer over the dielectric layer.

2. The method of claim 1 wherein the organic-material-removing fluid comprises about 0 weight percent particles at an initiation of the removing.

3. The method of claim 1 wherein the organic material comprises one or more of photoresist, non-photosensitive resist and polyimide.

4. The method of claim 1 further comprising baking the organic material prior to the removing.

5. The method of claim 1 wherein, after stopping the removing, a plug of the organic material remains in the recess and, prior to forming the dielectric layer, removing the plug to expose the first conductive-material-comprising layer lining the bottom and the sidewalls.

6. The method of claim 5 wherein the removing the plug comprises a chemical or plasma process.

7. The method of claim 1 wherein the first conductive-material-comprising layer comprises one or more of platinum, iridium, ruthenium, and tantalum.

8. The method of claim 1 wherein the first conductive-material-comprising layer comprises one or both of tantalum silicon nitride and tantalum nitride.

* * * * *

UNITED STATES PATENT AND TRADEMARK OFFICE
CERTIFICATE OF CORRECTION

PATENT NO.       : 7,115,515 B2
APPLICATION NO.  : 11/208793
DATED            : October 3, 2006
INVENTOR(S)      : Nishant Sinha It is certified that error appears in the above-identified patent and that said Letters Patent is hereby corrected as shown below:

Col. 5, line 2 –
  Replace "nitrides and suicides of various metals.  For example, in"
  With --nitrides and silicides of various metals.  For example, in--

Col. 5, line 16 –
  Replace "comprises a tantalum-containing mass.  Such mass can"
  With --comprise a tantalum-containing mass.  Such mass can--

Col. 8, line 55 –
  Replace "by using a single etching solutions to remove both of"
  With --by using a single etching solution to remove both of--

Col. 9, line 55 –
  Replace "materials other can also be employed.  Any and all of"
  With --materials or other can also be employed.  Any and all of--

Col. 9, line 57 –
  Replace "as chemical vapor deposition of physical vapor deposition"
  With --as chemical vapor deposition or physical vapor deposition--

Signed and Sealed this

Tenth Day of July, 2007

JON W. DUDAS
*Director of the United States Patent and Trademark Office*